United States Patent [19]

Wada et al.

[11] 4,272,724
[45] Jun. 9, 1981

[54] MAGNETIC MODULATOR FOR MAGNETIC FIELD DETECTION DIFFERENTIALLY OUTPUTTING MAGNETIC CORE NOISE

[75] Inventors: Tatsuhiko Wada, Shapporo; Zenuemon Abe, Yokohama, both of Japan

[73] Assignee: President of Hokkaido University, Tokyo, Japan

[21] Appl. No.: 964,380

[22] Filed: Nov. 28, 1978

[30] Foreign Application Priority Data

Jan. 28, 1978 [JP] Japan ................................... 53-8628

[51] Int. Cl.$^3$ ............................................. G01R 33/04
[52] U.S. Cl. ................................. 324/253; 324/117 R
[58] Field of Search ................... 324/117 R, 118, 127, 324/253, 254, 255, 260; 332/51 R, 5

[56] References Cited

U.S. PATENT DOCUMENTS

| | | | |
|---|---|---|---|
| 2,053,154 | 9/1936 | La Pierre | 324/254 X |
| 2,252,059 | 8/1941 | Barth | 324/253 |
| 2,406,360 | 8/1946 | Ellwood | 324/253 X |
| 2,649,568 | 8/1953 | Felch et al. | 324/254 |
| 2,695,384 | 11/1954 | Stuart | 324/254 |
| 2,725,520 | 11/1955 | Woodworth | 324/117 R |
| 2,822,533 | 2/1958 | Duinker et al. | 324/254 X |
| 2,958,036 | 10/1960 | Gilbert | 324/117 R X |
| 3,246,219 | 4/1966 | Devol et al. | 324/253 X |

OTHER PUBLICATIONS

Gordon et al., Recent Advances in Fluxgate Magnetometry IEE Trans. on Magnetics, vol. MAG-8, No. 1, Mar. 1972.

Burger, John R., The Theoretical Output of a Ring Core Fluxgate Sensor IEE Trans. on Magnetics, vol. MAG-8, No. 4, Dec. 1972.

*Primary Examiner*—Gerard R. Strecker
*Attorney, Agent, or Firm*—Robert E. Burns; Emmanuel J. Lobato; Bruce L. Adams

[57] ABSTRACT

A magnetic modulator for detection of a very small magnetic field and current, comprising a rectangular or annular one-piece magnetic core divided into a plurality of core legs which are adapted to be provided with exciting inputs in opposite directions to each other and with signal inputs in parallel thereto, and detecting coils wound around each leg so as to function differentially with respect to the core noise and the exciting input and cumulatively with respect to the signal input, thereby adequately reducing the core noise and well improving the signal-noise ratio.

13 Claims, 12 Drawing Figures

MAGNETIC MODULATOR FOR MAGNETIC FIELD DETECTION DIFFERENTIALLY OUTPUTTING MAGNETIC CORE NOISE

BACKGROUND OF THE INVENTION

This invention relates to a magnetic modulator comprising a one-piece magnetic core, and more particularly to an electric modulator that differentially outputs the magnetic core noise.

The magnetic modulator is widely used in devices to detect a very small magnetic field and current. The accuracy of these detectors depends on the signal-noise ratio of the modulator included. Namely, to decrease the noise of the modulator is to enhance the accuracy of the detector.

SUMMARY OF THE INVENTION

The object of this invention is to provide a magnetic modulator comprising a one-piece magnetic core that reduces noise component by connecting detecting coils wound around the bisected portions thereof so that the signal component becomes additive and the generated noise subtractive. The feature of the magnetic modulator according to this invention is that it is applicable to even such a very small magnetic field and current that have not been detected by the conventional magnetic modulators.

BRIEF DESCRIPTION OF THE DRAWINGS

Now the principle and feature of this invention that minimizes the noise of the magnetic modulator will be described in detail.

FIG. 5 shows a differentially composed one-piece magnetic core designed especially for the external input magnetic field.

FIG. 6. shows an annular noise-reducing magnetic modulator having an input coil.

FIG. 7 shows an annular magnetic core comprising a combination of several magnetic cores.

FIG. 8 shows the coupling portion of an annular magnetic core having the same cross section throughout and a magnetic flux leak shielding plate.

FIG. 9 shows a construction wherein an input magnetic guide is provided at the point where exciting magnetic flux becomes balanced.

FIG. 10 shows the connecting portion of an annular magnetic core having a cross coil and an input magnetic guide.

FIG. 11 shows a double annular magnetic core comprising an internal and an external ring.

FIG. 12 shows a grate-like magnetic core having an input leg and a detecting leg.

DETAILED DESCRIPTION OF THE INVENTION

Figure 1:
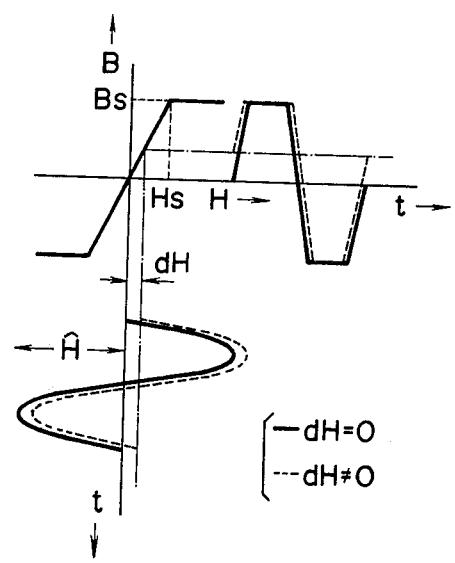
FIG. 1 plots a tripolygonal line showing the approximate magnetic characteristic of the magnetic modulator, a typical exciting sine wave, and an output magnetic flux.

To avoid the memorizing effect of the magnetic core, the magnetic modulator in general is designed with an exciting magnetic field intensity $\hat{H}$ that is sufficiently higher than the saturated magnetic field intensity Hs. For the sake of simplicity, therefore, the magnetic characteristic of a magnetic core can be expressed in the form of a tripolygonal curve as shown in FIG. 1. For the exciting wave, a sine, triangular or pulse wave that contains very little multiplied frequency components should be used. For convenience, this invention will be described with respect to the sine excitation that permits reducing the multiplied frequency components with relative ease.

On applying an input magnetic field dH to an exciting wave indicated by a solid line in FIG. 1, the operating point moves and the output magnetic flux becomes unsymmetrical about a point on the y-axis resulting in a wave indicated by a dotted line. Consequently, as already reported, a multiplied frequency component proportional to the input dH, i.e., an output voltage $V_{2f}$ that can be expressed as follows, is obtained in the detecting circuit:

$$v_{2f} = -8Nd \cdot f \cdot S \cdot \mu \cdot dH(2Hs/\hat{H}) \sqrt{1 - (Hs/\hat{H})^2} \sin 2\omega t \quad (1)$$

where
$\omega = 2\pi f$
Nd = number of the detecting wire winding
S = cross-sectional area of the magnetic core (m$^2$)
$\mu_o$ = permeability in a vacuum = $4\pi \times 10^{-7}$(H/m)
$\mu_m$ = maximum differential permeability of the magnetic core
$\mu = \mu_o \mu_m$
f = exciting frequency (Hz)
Hs = saturated magnetic field intensity
$\hat{H}$ = exciting magnetic field intensity
dH = input magnetic field (A/m)

As evident from equation (1), the sensitivity of a magnetic modulator depends on such coefficients of proportion as Nd, S and f. The sensitivity can be increased by increasing these coefficients.

Meanwhile, the lower measuring limit of a magnetic modulator depends mainly on the magnetic core noise due to the Barkhausen effect and fluctuations. The former is due to irregularities in the magnetic domain occurring during the magnetizing process wherein the magnetic core is excited. The latter is mainly due to cycle-to-cycle fluctuations in the quantity of magnetic flux during dynamic excitation. The lowest measuring limit heretofore attained, by utilizing the characteristic in the vicinity of the Curie point and increasing the exciting ratio and frequency, is $1 \times 10^{-6}$(A/m)/$\sqrt{Hz}$. But conventional magnetic core noise reducing measures all have resorted to the differential arrangement of paired magnetic cores, studying their common exciting and temperature conditions. The differentially composed one-piece magnetic cores have been used with fluxmeters and so on, but no detailed study has been given to their noise-reducing effect.

A magnetic core generates different noises in different parts thereof. The quantity of noise generated also is not uniform, depending on the material and size of the magnetic core. In a modulator employing paired magnetic cores, accordingly, noises of the individual cores are not correlated with each other, so that even differentially wound coils can hardly decrease the noises. By contrast, a one-piece magnetic core 2 shown in FIG. 2 has an adequately higher permeability than in the atmosphere, so that substantially all magnetic fluxes due to the core noise flow therein. The core 2 defines a continuous magnetic circuit loop, and the core has a pair of magnetic core legs 5, 6 which partially define the magnetic circuit loop. The pair of detecting coils 4($N_1$) and 4($N_2$) are differentially connected and disposed on the core so that the excitation magnetic field flowing through the continuous magnetic circuit loop defined by the core flows in opposite respective directions through the pair of detecting coils. Therefore, noises outputted from bisected detecting coils 4($N_1$ and $N_2$) are strongly correlated if an exciting coil 3, connected to an exciting source 3', is so wound as to instantaneously provide a magnetic field in the direction of a solid arrow or in the opposite direction, and the detecting coils are configured symmetrically as illustrated. By connecting both coils to such polarities that cancel the exciting component, the magnetic core noise in the output from a differential amplifier 30 is reduced by the amount that is proportional to the degree of correlation and the degree of balance $\gamma$ of the coils. On inserting a signal input magnetic field (indicated by an dotted arrow), outputs from the upper and lower core legs are added together in the detecting coil.

Figure 2:
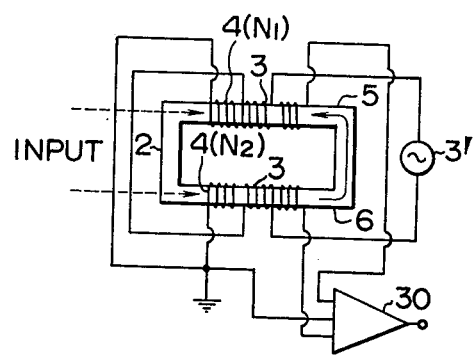
FIG. 2 shows an example of the differential structure of detecting coils wound around a one-piece magnetic core.
Figure 3:
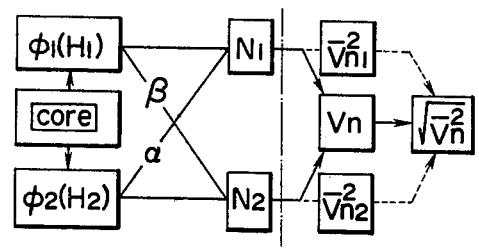
FIG. 3 illustrates the relationship among individual factors concerning the noise-reducing, differentially composed one-piece magnetic core according to this invention.

Next, the core noise reduced by the differentially wound one-piece magnetic core is compared with that obtained by the conventional method. Let's assume that the upper and lower core legs in FIG. 2, on which the detecting coils $N_1$ and $N_2$ are wound, generate noise magnetic fluxes $\phi_1$ and $\phi_2$, respectively. Also, noise magnetic fluxes emitted outside the magnetic core due to its permeability and shape are indicated by $\alpha$ and $\beta$. Their relationship is shown in FIG. 3. Now, the noise magnetic fluxes $\phi_{n1}$ and $\phi_{n2}$ for $N_1$ and $N_2$ in the upper and lower core legs are expressed as follows:

$$\phi_{n1} = \phi_1 + \alpha\phi_2, \quad \phi_{n2} = \phi_2 + \beta\phi_1 \quad (2)$$

Given that the permeability and the cross-sectional area are equal throughout the entire magnetic core, $\phi_1$ and $\phi_2$ produce magnetic fields $H_1$ and $H_2$, respectively. Because they are very small, $H_1$ and $H_2$ can be substituted for dH in equation (1). If voltages due to $\phi_{n1}$ and $\phi_{n2}$ are $v_{n1}$ and $v_{n2}$, respectively, equation (2) can be rearranged as:

$$v_{n1} = KN_1(H_1 + \alpha H_2), \quad v_{n2} = KN_2(H_2 + \beta H_1) \quad (3)$$

where
K = coefficient of proportion determining the sensitivity

Assuming that the magnetic core is composed highly symmetrically and equal amounts of magnetic fluxes leak from the upper and lower core legs, $\alpha \simeq \beta$. Then, the square mean $\overline{v_n^2}$ of the noise output voltage after differentiation is expressed as:

$$\overline{v_n^2} = \overline{(v_{n1} - v_{n2})^2} \quad (4)$$
$$= K^2\{\overline{(N_1 - \beta N_2)^2 \cdot H_1^2} + \overline{(N_2 - \alpha N_1)^2 \cdot H_2^2}\}$$

With the conventional differentially composed paired magnetic cores, $\alpha = \beta = 0$, and their noise $\overline{v_n'^2}$ is expressed as:

$$\overline{v_n'^2} = K^2\{\overline{(N_1 H_1)^2} + \overline{(N_2 H_2)^2}\} \quad (5)$$

where K, $N_1$, $N_2$, etc. are the same as before.

Therefore, the noise-reducing rate $\eta$ with the conventional arrangement is derived from equations (4) and (5) as follows:

$$\eta = \left(\frac{\overline{v_n^2}}{\overline{v_n'^2}}\right)^{\frac{1}{2}} \quad (6)$$

$$= \left\{\frac{\overline{(N_1 - \beta N_2)^2 \cdot H_1^2} + \overline{(N_2 - \alpha N_1)^2 \cdot H_2^2}}{\overline{(N_1 H_1)^2} + \overline{(N_2 H_2)^2}}\right\}^{\frac{1}{2}}$$

Assuming that $\overline{H_1^2} \simeq \overline{H_2^2}$ and $N_2 = N_1 + \delta N$, equation (7) is obtained as $$\eta = \left\{(1 + \alpha)^2 - \frac{4\alpha N_1(N_1 + \delta N)}{N_1^2 + (N_1 + \delta N)^2}\right\}^{\frac{1}{2}} \quad (7)$$

If $N_1 > |\delta N|$, equation (7) can be rearranged as $$\eta = \left\{(1 - \alpha)^2 + \frac{N_2 - N_1}{N_1} \cdot 2\alpha\right\}^{\frac{1}{2}} \quad (8)$$

Accordingly, the reducing rate $\eta$ of magnetic core noises occurring randomly at different parts of a magnetic core depends on the coupling coefficient $\alpha$ and the detecting coils $N_1$ and $N_2$. As seen from equation (8), good results are obtained by approximating $\alpha$ to 1 and $N_2$ to $N_1$ as much as possible.

In FIG. 3, $\phi_1(H_1)$ and $\phi_2(H_2)$ are noise magnetic fluxes (magnetic field intensities), $N_1$ and $N_2$ are the numbers of detecting coil windings, $\alpha$ and $\beta$ are coupling coefficients, $v_n$ is output noise after differentiation, $\sqrt{\overline{v_n^2}}$ is output noise, and $\overline{v_{n1}^2}$ and $\overline{v_{n2}^2}$ are square means of output noises at $\phi_1$ and $\phi_2$.

The coupling coefficients $\alpha$ and $\beta$ substantially depend on the leakage of noise magnetic flux that varies with the core structure, permeability, coil winding method, and so on. Magnetic flux leaks outside the magnetic core when excited to saturation. Then little core noise exists. Therefore, in many cases where this leakage is negligible, the core noise reducing rate $\eta$ in the differential one-piece magnetic core of FIG. 2 is determined by the balance of coils $\gamma$ as expressed below:

$$\eta \simeq \gamma = |(N_2 - N_1)/N_1| \quad (9)$$

Figure 4:
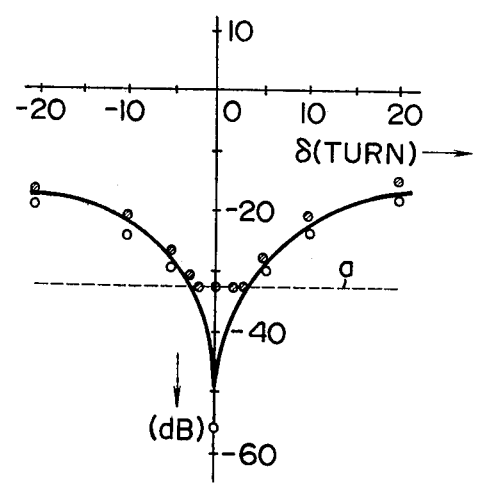
FIG. 4 plots a change in the number of detecting coil wire wound (x-axis) versus the magnetic core noise reducing rate and the balance of the coils (y-axis).

The foregoing is the basic principle of this invention. FIG. 4 shows the results of an experiment that was conducted to establish this principle. It shows the core noise reducing rate $\eta$ (indicated by solid circles) obtained by fixing $N_1$ (e.g., $N_1 = 100$ times) and changing $N_2$ (e.g., $N_2 = 100 \pm \delta$ times), and the coil balance $\gamma$ (indicated by hollow circles) derived from the actual sensitivity of a partially single-wound coil applied with an input magnetic field. In this figure, the reducing rate $\eta$ under the dotted straight line (indicating the noise level $\alpha$ of the detecting circuit) is limited by the noise of the detecting circuit, but it drops to the same level as the balance $\gamma$.

Accordingly, it is apparent from equation (9) and the results of FIG. 4 that as much core noise as is equivalent to the detecting coil balance can be reduced.

Figure 5:
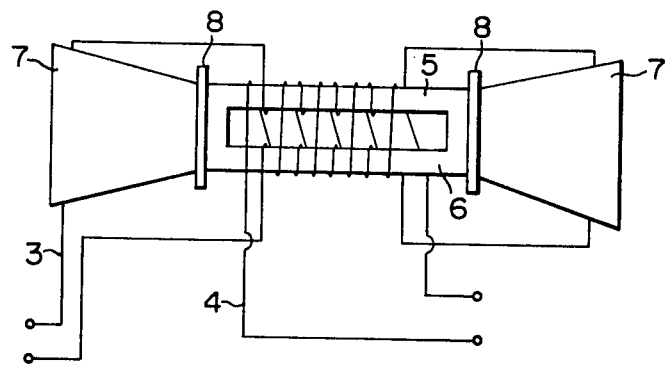
FIGS. 5 through 12 show other embodiments of this invention.

The above description concerns an embodiment wherein two detecting coils are differentially wound. The same result is obtained by winding one detecting coil 4 around the two core legs 5, 6 as shown in FIG. 5, in which similar reference numerals designate such parts that correspond to those in FIG. 2. In addition, this embodiment has an input-magnetic-field-focusing magnetic guide 7 that reduces the diamagnetic field and efficiently introduces the external input magnetic field to the magnetic modulator and also has such a nonmagnetic member such as a copper shielding plate 8 for preventing the leakage of excitation fields to the magnetic guide which results in an increase in noise magnetic fluxes. The diamagnetic field can similarly be reduced by extending the modulating one-piece core 2 itself in the direction of input or by providing some space instead of providing said shielding plate 8.

Figure 6:
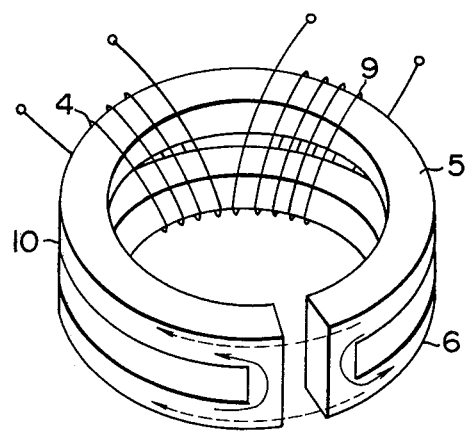
Figure 7:
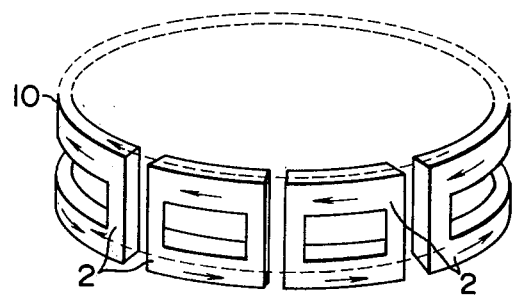

FIGS. 6 and 7 show two types of annular, noise-reducing magnetic cores 10 that are designed especially for a very small input current introduced through an input coil 9. The embodiment of FIG. 6 is similar to one in FIG. 2, but the upper and lower legs of the magnetic core 2 are ring-shaped. Excitation is instantaneously provided to the upper leg 5 and the lower leg 6 in the direction of a solid arrow or in the opposite direction. The detecting coil 4 is wound around the annular magnetic core 10 like the input coil 9. In the embodiment of FIG. 7, the magnetic core 10 in FIG. 6 is divided into several units, in order to eliminate the leakage of noise magnetic flux and reduce the magnetic resistance of the upper and lower legs. In other words, a plurality of one-piece cores 2 are annularly combined. Excitation, detection, input and other conditions are the same as with the embodiment of FIG. 6. In FIGS. 6 and 7, therefore, input is provided in the direction of a dotted arrow or in the opposite direction. Consequently, the detecting coil 4 functions cumulatively with respect to the signal input and differentially with respect to the core noise and exciting component.

Figure 8:
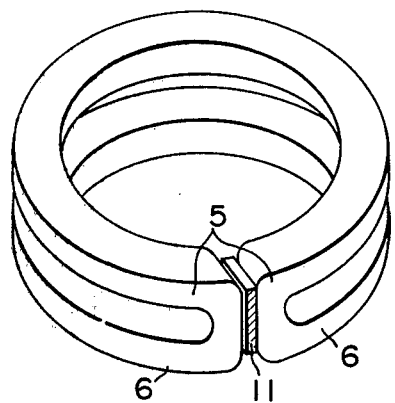
Figure 9:
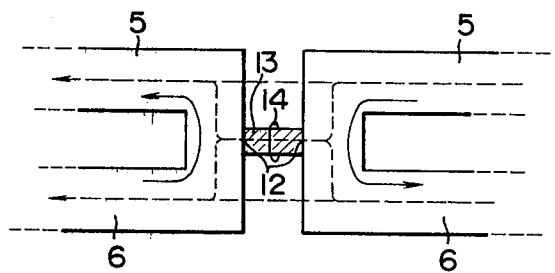
Figure 10:
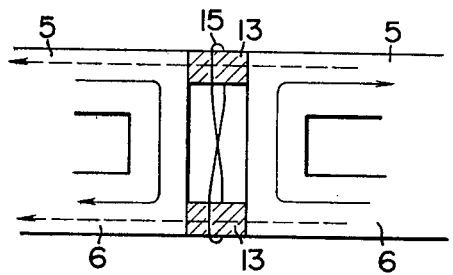

FIGS. 8 through 10 show different coupling parts of the magnetic cores shown in FIGS. 6 and 7. The embodiment of FIG. 8 has the same cross-sectional area both in its coupling portion and in its straight leg portion so that the same exciting magnetic flux is established throughout its entirety. The corners of the upper leg 5 and the lower leg 6 are bevelled to prevent the leakage of noise magnetic flux to the outside. The space between the coupling ends is minimized to facilitate the flow of input magnetic flux. In addition, a small, thin plate 11 of non-magnetic material, such as copper, is inserted therein to prevent the leakage of exciting and noise magnetic fluxes. The embodiment of FIG. 9 has a magnetic guide 13 for an input magnetic flux at a balance point 12 where exciting magnetic fluxes become zero by mutual offsetting, thereby preventing reduction of such inputs as DC magnetic flux in said space. This magnetic guide 13 is provided with a short-circuit coil 14 to prevent the leakage of any residual exciting component which might give rise to core noise. In FIG. 10, the magnetic guide 13 of FIG. 9 is provided to each of the upper leg 5 and the lower leg 6. A cross short-circuit coil 15 is wound around the two magnetic guides 13. In this embodiment, input magnetic flux flows in the direction of a dotted arrow with no losses, and the leakage of exciting and noise magnetic fluxes is prevented by the short-circuitting effect of the coil 15.

Figure 11:
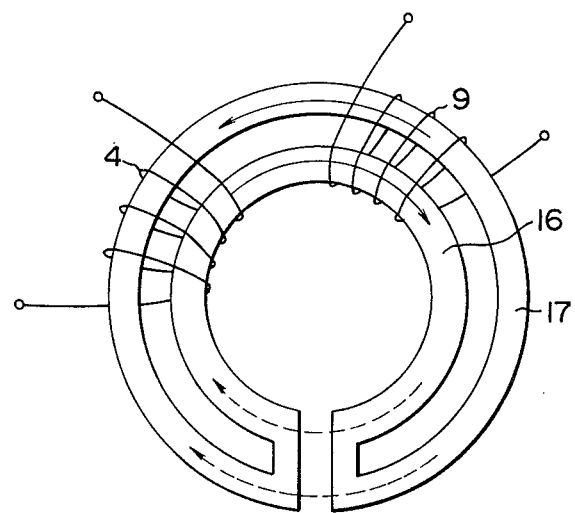

The annular magnetic cores in FIGS. 6 through 10 each comprise the upper leg 5 and the lower leg 6. It is apparent that a double annular magnetic core, comprising an internal leg 16 and an external leg 17 as shown in FIG. 11, also functions on absolutely the same principle as described above.

Figure 12:
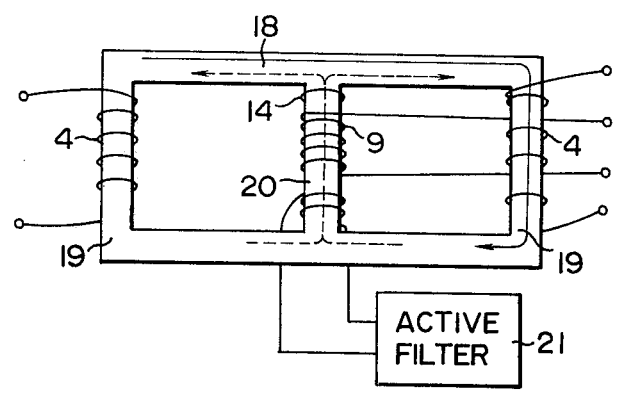

FIG. 12 shows a grate-like magnetic core 18 designed on the above-described differential core noise reducing principle. In this magnetic core 18, an exciting magnetic field is instantaneously provided in the direction of a solid arrow or in the opposite direction, and an input magnetic field in the direction of a dotted arrow or in the opposite direction through the input coil 9. It is evident that the differentially wound detecting coils 4 on parallel legs 19 reduce exciting and noise magnetic fluxes. In the center leg 20 that provides the input, excitation is reduced to zero by offsetting. Where any residual exciting component should be eliminated, a short-circuit coil 14 or an active filter 21 passing only signal components is provided. Based on the same principle as said annular magnetic cores, this embodiment also incorporates an input magnetic guide and other modifications described previously.

It is evident that the magnetic modulators with the magnetic cores embodying the principle of this invention are capable of measuring very small magnetic fields such as range from $10^{-9}$ to $10^{-10}$ gauss.

What is claimed is:

1. A low noise magnetic modulator, comprising:
   a one-piece magnetic core defining a continuous magnetic circuit loop and having a pair of magnetic core legs which partially define the continuous magnetic circuit loop;
   excitation means for generating an excitation magnetic field flowing through the continuous magnetic circuit loop defined by said core and through each of said core legs in opposite directions relative to each other; and
   a pair of detecting coils wound on said core, said pair of detecting coils being differentially connected and disposed on said core so that the excitation magnetic field flowing through the continuous magnetic circuit loop defined by said core flows in opposite respective directions through said pair of detecting coils for cancelling detected magnetic core noise and for adding detected magnetic input signals applied to said core in a direction parallel to the portion of said core on which said detecting coils are wound, said detecting coils respectively having $N_1$ coil windings and $N_2$ coil windings, and said pair of detecting coils having a balance parameter $\gamma$ at least approximately equal to zero, wherein $\gamma = |(N_2 - N_1)/N_1|$, for maximizing core noise cancellation.

2. A low noise magnetic modulator according to claim 1, further comprising: an input magnetic guide for focusing an input magnetic field into said magnetic core; a short-circuited coil wound around said input magnetic guide; and an active filter connected to said short-circuited coil effective for creating a magnetic circuit path through said input magnetic guide which passes only input magnetic field components and which blocks residual excitation magnetic field components.

3. A low noise magnetic modulator according to claim 1, further comprising a magnetic guide of ferromagnetic material positioned adjacent a portion of said magnetic core which receives an external input magnetic field, in use, for enhancing measurement of the input magnetic field by reducing any diamagnetic field induced by the input magnetic field and by focusing the input magnetic field into said magnetic core.

4. A noise-reducing magnetic modulator according to claim 3, wherein a small, thin plate of copper and other non-magnetic material is provided where said input magnetic guide and the magnetic core are coupled together so that leakage flux due to core noise and exciting component of the magnetic modulator is prevented from flowing into the magnetic guide.

5. A low noise winding-input type magnetic modulator, comprising:
an annular one-piece magnetic core comprised of a ring-shaped first leg having a pair of opposite ends facing each other and spaced by a narrow gap, a ring-shaped second leg having a pair of opposite ends facing each other and spaced by a narrow gap, wherein said first leg is positioned aligned with and concentric to said second leg with the respective gaps in said first and second legs aligned, and magnetic material bridging between adjacent ends of said first and second legs to define a continuous magnetic circuit loop through said annular one-piece magnetic core;
excitation means for generating an excitation magnetic field flowing through the continuous magnetic circuit loop and through each of said core legs in opposite directions relative to each other; and
detecting coils wound on said core interconnected and oriented in directions so that respective currents induced in said detecting coils by magnetic core noise and by the excitation magnetic field are cancelled and detected magnetic input signals applied parallel and in the same direction to said first and second legs are added to permit the detection of extremely weak input magnetic fields.

6. A low noise winding-input type magnetic modulator according to claim 5, wherein said first and second ring-shaped legs have generally equal diameters with said first leg disposed above said second leg.

7. A low noise winding-input type magnetic modulator according to claim 5, wherein said first ring-shaped leg has a diameter less than a diameter of said second ring-shaped leg and is disposed within said second ring-shaped leg.

8. A noise-reducing magnetic modulator according to claim 5, 6 or 7, wherein the annular magnetic core comprises a plurality of one-piece magnetic cores to increase the efficiency of noise reduction by decreasing the magnetic resistance of the core and thereby reducing the leakage flux of core noise.

9. A noise-reducing magnetic modulator according to claims 5, 6 or 7, wherein the corners of the rectangular or annular one-piece magnetic core are bevelled and both the straight and curved leg portions thereof have the same cross-sectional area, whereby a uniform exciting magnetic flux is established therein and the leakage flux is prevented.

10. A noise-reducing magnetic modulator according to claims 5, 6 or 7, wherein a small, thin plate of copper or other non-magnetic material is inserted in the small space between both ends of the annular magnetic core, whereby the flow of magnetic flux due to the input signal is facilitated and the leakage flux of core noise impairing the noise-reducing effect is prevented.

11. A noise-reducing magnetic modulator according to claims 5, 6 or 7, wherein two symmetrical input magnetic guides, wound with a cross short-circuit coil, are provided in the space between the coupling portions of the annular magnetic core, thereby passing only such input magnetic fluxes as are caused by signals.

12. A noise-reducing magnetic modulator according to claims 5, 6 or 7, wherein a magnetic guide for the input magnetic flux is provided at the balance point where excitation becomes zero due to mutual offsetting of exciting magnetic fluxes, in order to reduce the magnetic flux due to the input signal in the space between the coupling portions of the annular magnetic core.

13. A noise-reducing magnetic modulator according to claim 12, wherein a short-circuit coil is provided to prevent the flow of exciting component to said magnetic guide for the input magnetic flux.

* * * * *